United States Patent
Priel et al.

(10) Patent No.: US 7,688,100 B2
(45) Date of Patent: Mar. 30, 2010

(54) INTEGRATED CIRCUIT AND A METHOD FOR MEASURING A QUIESCENT CURRENT OF A MODULE

(75) Inventors: Michael Priel, Hertzelia (IL); Dan Kuzmin, Givat Shmuel (IL); Michael Simkhis, Petah Tikva (IL)

(73) Assignee: Freescale Semiconductor, Inc., Austin, TX (US)

( * ) Notice: Subject to any disclaimer, the term of this patent is extended or adjusted under 35 U.S.C. 154(b) by 17 days.

(21) Appl. No.: 12/164,622

(22) Filed: Jun. 30, 2008

(65) Prior Publication Data

US 2009/0322367 A1 Dec. 31, 2009

(51) Int. Cl.
*G01R 31/26* (2006.01)
(52) U.S. Cl. .................................................. 324/765
(58) Field of Classification Search ............... 324/158.1, 324/763–765
See application file for complete search history.

(56) References Cited

U.S. PATENT DOCUMENTS

| | | | | |
|---|---|---|---|---|
| 6,894,503 B2 * | 5/2005 | Shi et al. | ..... | 324/537 |
| 7,282,905 B2 * | 10/2007 | Chen et al. | ..... | 324/158.1 |
| 7,301,347 B2 * | 11/2007 | Dearn et al. | ..... | 324/522 |
| 2005/0104612 A1 | 5/2005 | Hsu et al. | | |
| 2006/0125470 A1 * | 6/2006 | Chen et al. | ..... | 324/158.1 |

FOREIGN PATENT DOCUMENTS

JP        06-148264        5/1994

* cited by examiner

*Primary Examiner*—Ha Tran T Nguyen
*Assistant Examiner*—Joshua Benitez (57) ABSTRACT

A method for evaluating a quiescent current, the method includes: measuring, when a module is at a first mode, a first voltage drop on a first resistor that is coupled between a supply pin of an integrated circuit that comprises the module and a first test pin of the integrated circuit; assessing, when the module is at a second mode, a second voltage drop on a second resistor that is coupled between the supply pin and a second test pin of the integrated circuit; and evaluating a quiescent current of the module in response to the first and second voltage drops; wherein expected values of quiescent current of the module differ from one mode to the other; and wherein a resistance of the first resistor differs from the resistance of the second resistor.

20 Claims, 8 Drawing Sheets

FIG. 8

INTEGRATED CIRCUIT AND A METHOD FOR MEASURING A QUIESCENT CURRENT OF A MODULE

FIELD OF THE INVENTION

The present invention relates to an integrated circuit and to methods for measuring a quiescent current.

BACKGROUND OF THE INVENTION

Wikipedia defines Iddq testing as a method for testing CMOS integrated circuits for the presence of manufacturing faults. This testing relies on measuring the supply current (Idd) in the quiescent state (when the circuit is not switching). The current consumed in the state is commonly called Iddq for Idd (quiescent) and hence the name.

Iddq testing uses the principle that in a correctly operating quiescent CMOS digital circuit, there is no static current path between the power supply and ground, except for a small amount of leakage. Many common semiconductor manufacturing faults will cause the current to increase by orders of magnitude, which can be easily detected. This has the advantage of checking the chip for many possible faults with one measurement. Another advantage is that it may catch faults that are not found by conventional stuck-at fault test vectors.

Iddq testing is somewhat more complex than just measuring the supply current. If a line is shorted to Vdd, for example, it will still draw no extra current if the gate driving the signal is attempting to set it to '1'. However, a different vector set that attempts to set the signal to 0 will show a large increase in quiescent current, signalling a bad part. Typical Iddq test vector sets may have 20 or so vectors.

Many modern integrated circuits apply aggressive power saving techniques. One well known power saving technique involves placing a module of the integrated circuit in a so-called low power mode. This can involve shutting down the entire module or shutting down major portions of the module.

The quiescent current of a module that operates in a low power mode can be very small. The measurement of such a quiescent current can be very problematic and subject to various noises.

The quiescent current of a shut down module can be much smaller than the quiescent current of the same module when operating in a non-low power mode. The quiescent current of the former can be less than one percent of the latter.

Iddq tests are relatively time consuming, particularly when using external testers that are not aware of the operational mode of the module.

SUMMARY OF THE PRESENT INVENTION

The present invention provides a method and a device as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

Further details, aspects, and embodiments of the invention will be described, by way of example only, with reference to the drawings.

DETAILED DESCRIPTION OF THE DRAWINGS

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the following specification, the invention will be described with reference to specific examples of embodiments of the invention. It will, however, be evident that various modifications and changes may be made therein without departing from the broader spirit and scope of the invention as set forth in the appended claims.

It has been found that the quiescent current of a module of an integrated circuit can be measured when the module is in different modes, through using different test paths. The characteristics of these different test paths can be designed according to expected quiescent currents of a functional as well as a non-functional module in each of these different modes. For example, quiescent currents of a module that is in different modes can be evaluated by measuring a voltage drop on different resistors that are connected between a supply pin of the module to one or more test pins. The resistance of each resistor is responsive to the expected quiescent current of the module per each mode.

An integrated circuit is provided. It includes: (i) at least one module that can be placed, at a given point in time, in a first mode or in a second mode; wherein an expected quiescent current of the module differs from one mode to the other; and (ii) multiple test paths, coupled to each module, wherein a first test path is associated with the first mode and a second test path is associated with the second mode. The first test path comprises a first test pin and a first resistor and the second test path comprises a second test pin and a second resistor. The first resistor is coupled between the first test pin and a supply pin of the module. The second resistor is coupled between the second test pin and a supply pin of the module. A quiescent current of the module when placed at a first mode, is measured by supplying a supply voltage to the first test pin and measuring a voltage drop on the first resistor. A quiescent current of the module when placed at a second mode, is measured by supplying a supply voltage to the second test pin and measuring a voltage drop on the second resistor.

Figure 1:
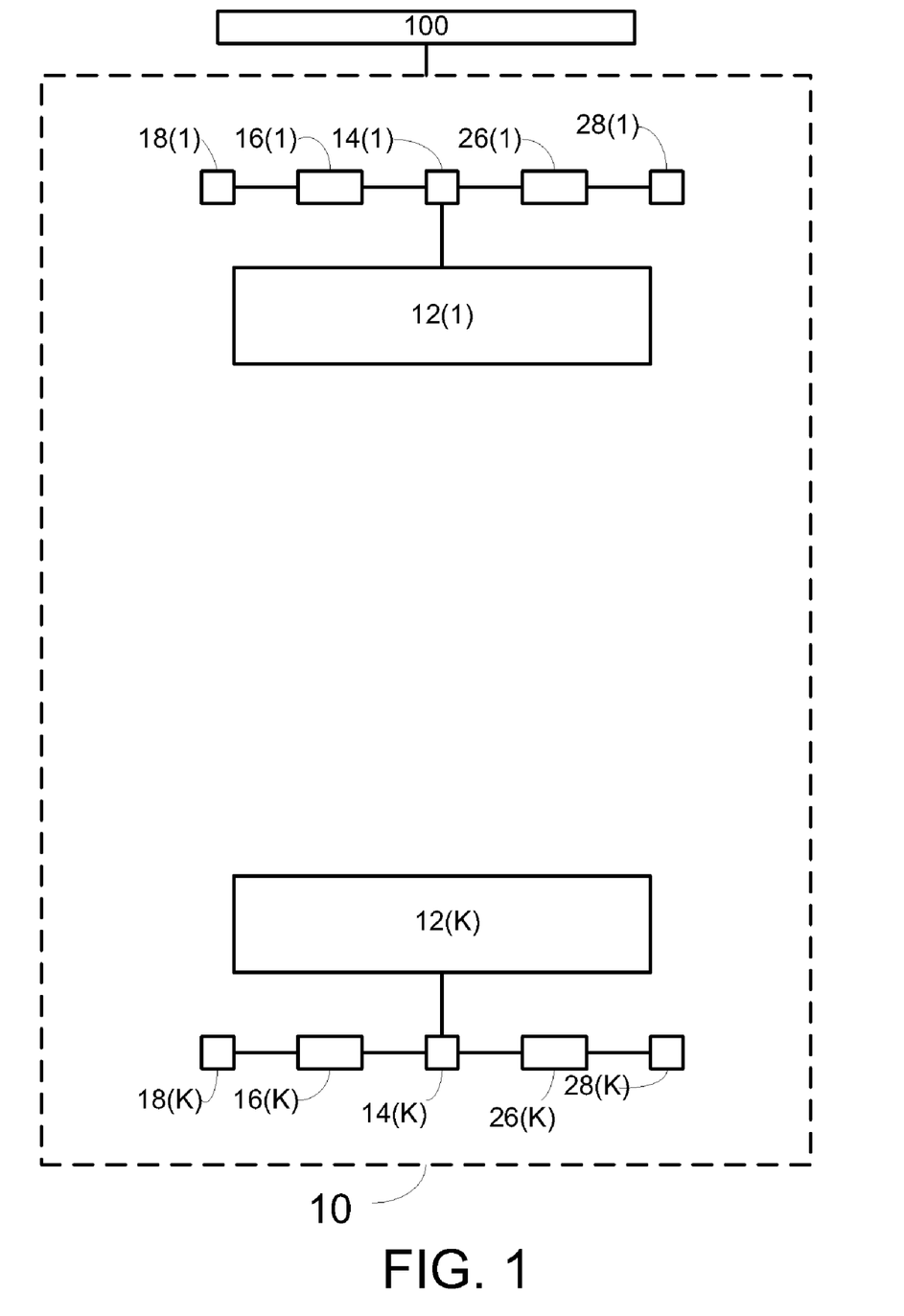
FIG. 1 schematically shows an example of an embodiment of an integrated circuit and of an external tester.

FIG. 1 schematically shows an example of an embodiment of an integrated circuit 10 and of a tester 100.

Integrated circuit 10 includes multiple modules 12(1)-12(K). K being a positive integer. K can be equal to one or exceed one. Each module can be placed in a mode out of multiple modes, wherein at least one mode is a low power mode and at least one other mode is a non-low power mode. The non-low power mode can be a "normal" mode in which the module usually operates or a high power mode.

The power consumption of a module and its quiescent current is expected to change from one mode to the other. The different power consumption can result from shutting down different circuits per each mode. A greater number of shut down circuits can result in lower quiescent currents.

A quiescent current of a faulty module (when at a first mode) are higher than the quiescent current of a functional module (when at a first mode). Both currents are much smaller than the quiescent currents of a functional or faulty module when it is set to another mode.

If the expected quiescent currents (of a faulty or functional module) resulting from more than two modes substantially differ from each other then more than two test paths can be allocated per module. In the example of FIG. 1 and in the example of FIG. 2, a test path includes a resistor and a test pin, in the example of FIGS. 3 and 4 a test path includes a resistor that is connected to a multiplexer, and in the example of FIG. 5 a test path includes a resistor, a test pin and a switch.

For simplicity of explanation, FIG. 1-FIG. 5 illustrate two test paths per module, wherein one test path (referred to as low power mode test path) is used for measuring a low power mode quiescent current and another test path (referred to as normal mode test path) is used for measuring a normal mode quiescent current. A low power mode quiescent current of a module is a quiescent current that is measured when the module is in a low power mode. A normal mode quiescent current of a module is a quiescent current that is measured when the module is in a normal mode.

Modules 12(1)-12(K) are mutually independent in the sense that the mode of each module can be determined regardless of the modes of other modules. A module can include all circuits within a single voltage region.

A module can receive a supply voltage via a supply pin (when its quiescent current is not measured) or via a test pin (when its quiescent current is measured).

In the example of FIG. 1, modules 12(1)-12(K) receive supply voltages via supply pins 14(1)-14(K) or via pairs of test pins (18(1)-18(K) and 28(1)-28(K)).

Test pins 18(1)-18(K) are used for supplying a supply voltage to modules 12(1)-12(K) when the low power mode quiescent current of these modules is measured and test pins 28(1)-28(K) are used for supplying a supply voltage to modules 12(1)-12(K) when the normal mode quiescent current of these modules is measured.

The low power mode quiescent current of a module is expected to be smaller, or even much smaller than the normal mode quiescent current of the module. Ratios of one to ten, one to hundred, or even more, can characterize typical modules.

Using the same test path for both modes can cause a sensitivity problem of a large voltage drop. A sensitivity problem can arise when measuring the low power mode quiescent current of a module. The low power mode quiescent current is very small and hard to measure if the test path includes a small resistor. In this case measurement errors can be caused due to small voltage drops that should be formed on that resistor. A large voltage drop can be formed when measuring the normal mode quiescent current of the module. The normal mode quiescent current is much larger than the low power mode quiescent current and a substantial voltage drop can be developed on a large resistor. This voltage drop can affect the functionality of the module.

Each figure in FIG. 1-FIG. 5 illustrates an integrated circuit that includes multiple test paths per module. Each test path provides a good trade off between sensitivity and voltage drop. A low power mode test path includes a resistor with greater resistance than that of a resistor of a normal mode test path. The ratio between these resistances can be proportional to the ratio between the expected values of the normal mode quiescent current and the low power mode quiescent current. If the resistance ratio equals (or substantially equals) the expected quiescent currents ratio then substantially the same voltage drop should develop on these resistors, thus simplifying the measurements of this voltage drop.

Referring to the example of FIG. 1, external tester 100 is connected to integrated circuit 10. Integrated circuit 10 includes multiple modules such as modules 12(1) and 12(K).

Module 12(1) is connected to supply pin 14(1). First resistor 16(1) is connected between supply pin 14(1) to first test pin 18(1). Second resistor 26(1) is connected between supply pin 14(1) to second test pin 28(1).

The low power mode test path of module 12(1) includes first test pin 14(1) and first resistor 16(1). The normal mode test path of module 12(1) includes second test pin 28(1) and second resistor 26(1).

Module 12(1) receives a supply voltage via supply pin 14(1) when the quiescent current of module 12(1) is not evaluated.

External tester 100 supplies a supply voltage to module 12(1) via first test pin 18(1). External tester 100 is also connected to supply pin 14(1) in order to determine the voltage drop (referred to as first voltage drop) on first resistor 16(1). This voltage drop equals the low power mode quiescent current of module 12(1) multiplied by the resistance of first resistor 16(1).

The low power mode quiescent current is expected to be small (about one micro-Ampere) and the resistance of first resistor 16(1) is high (at least few hundred kilo-ohms) and an expected voltage drop of few tens of volts is expected to be developed on first resistor 18(1).

External tester 100 supplies a supply voltage to module 12(1) via second test pin 28(1). External tester 100 is also connected to supply pin 14(1) in order to determine the voltage drop (referred to as second voltage drop) on second resistor 26(1). This voltage drop equals the normal mode quiescent current of module 12(1) multiplied by the resistance of second resistor 26(1).

The normal mode quiescent current is expected to be high (about one milli-Ampere) and the resistance of the second resistor is low (at least few kilo-ohms) that an expected voltage drop of few tens of a volts is expected to be developed on first resistor 28(1).

The functionality of module 12(1) can be evaluated by these measured quiescent currents—if one (or both) quiescent current(s) are inside a fault region then 12(1) is deemed faulty.

The values of the low power mode quiescent current and of the normal mode quiescent current can be stored for various purposes, including generating manufacturing process statistics. Such statistics can be gained after multiple modules or multiple integrated circuits are tested.

Module 12(K) is connected to supply pin 14(K). Third resistor 16(K) is connected between supply pin 14(K) to third test pin 18(K). Fourth resistor 26(K) is connected between supply pin 14(K) to fourth test pin 28(K).

The low power mode test path of module 12(K) includes third test pin 14(K) and third resistor 16(K). The normal mode test path of module 12(K) includes fourth test pin 28(K) and fourth resistor 26(K).

Module 12(K) receives a supply voltage via supply pin 14(K) when the quiescent current of module 12(K) is not evaluated.

External tester 100 supplies a supply voltage to module 12(K) via third test pin 18(K). External tester 100 is also connected to supply pin 14(K) in order to determine the voltage drop (referred to as third voltage drop) on third resistor 16(K). This voltage drop equals the low power mode quiescent current of module 12(K) multiplied by the resistance of third resistor 16(K).

The low power mode quiescent current is expected to be small (about one micro-Ampere) and the resistance of third resistor 16(K) is high (at least few hundred kilo-ohms) and an expected voltage drop of few tens of a volts is expected to be developed on third resistor 18(K).

External tester 100 supplies a supply voltage to module 12(K) via fourth test pin 28(K). External tester 100 is also connected to supply pin 14(K) in order to determine the voltage drop (referred to as fourth voltage drop) on fourth resistor 26(K). This voltage drop equals the normal mode quiescent current of module 12(K) multiplied by the resistance of fourth resistor 26(K).

The normal mode quiescent current is expected to be high (about one milli-Ampere) and the resistance of the fourth resistor is low (at least few kilo-ohms) that an expected voltage drop of few tens of a volts is expected to be developed on third resistor 28(K).

The functionality of module 12(K) can be evaluated by these measured quiescent currents—if one (or both) quiescent current(s) are inside a fault region then 12(K) is deemed faulty.

The values of the low power mode quiescent current and of the normal mode quiescent current can be stored for various purposes, including generating manufacturing process statistics. Such statistics can be gained after multiple modules or multiple integrated circuits are tested.

Figure 2:
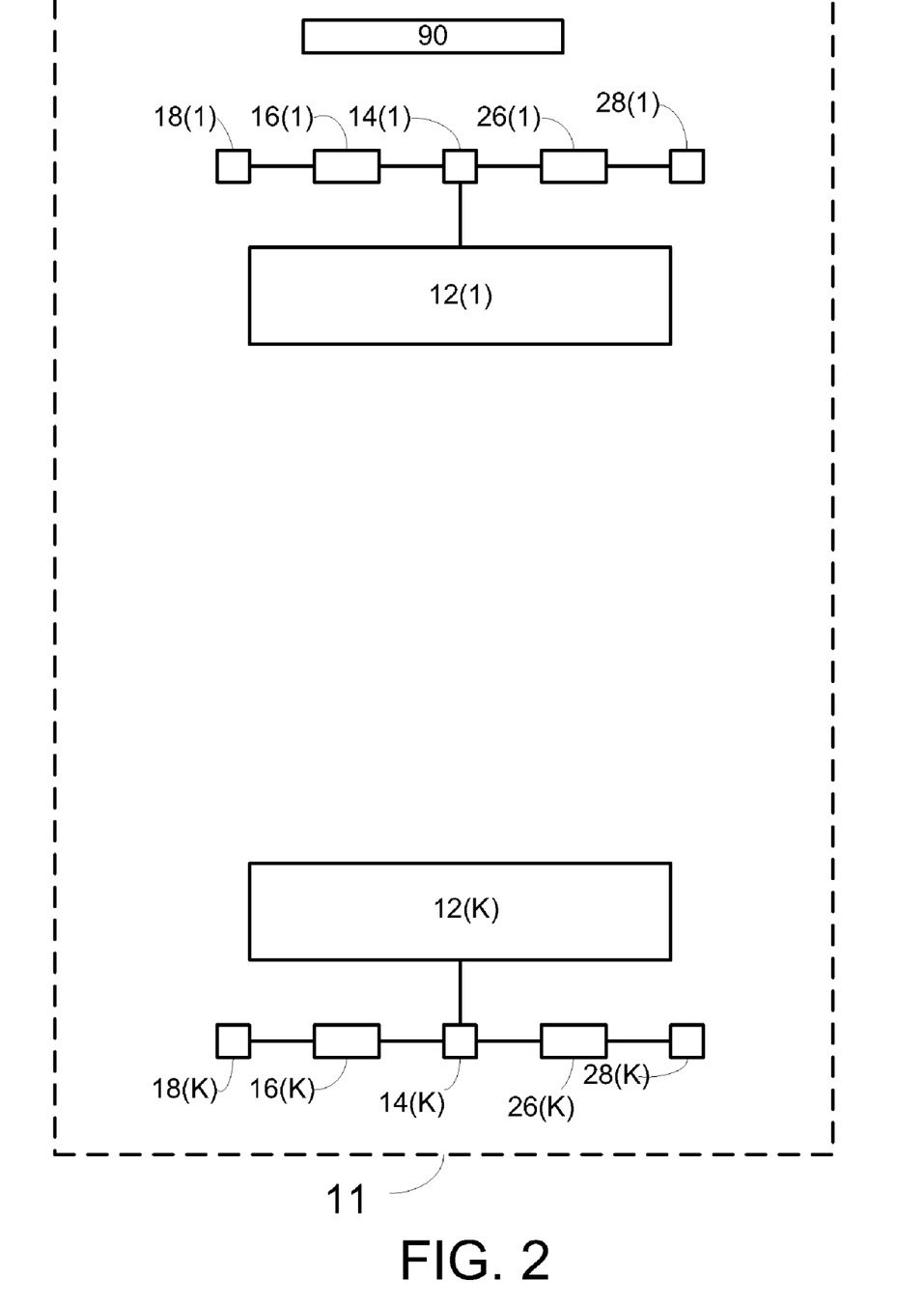
FIG. 2 schematically shows an example of an embodiment of an integrated circuit.

FIG. 2 schematically shows an example of an embodiment of an integrated circuit 11.

Integrated circuit 11 differs from integrated circuit 10 of FIG. 1 by including an internal tester 90 instead of external tester 100.

Internal tester 90 measures the voltage drop on first resistor 16(1), third resistor 12(K), second resistor 26(1) and fourth resistor 26(K).

Modules 12(1) and 12(K) receive their supply voltage via supply pins 14(1) and 14(K) when their quiescent current is not measured. A supply voltage is supplied to first test pin 18(1) when the low power mode quiescent current of module 12(1) is measured. A supply voltage is supplied to third test pin 28(1) when the normal mode quiescent current of module 12(1) is measured. The same is applied to module 12(K), its supply pin 14(K) and its test pin 28(K).

The supply voltage can be provided to supply pins 14(1) and 14(K) by an external power supply unit and can even be supplied by an external tester.

Figure 3:
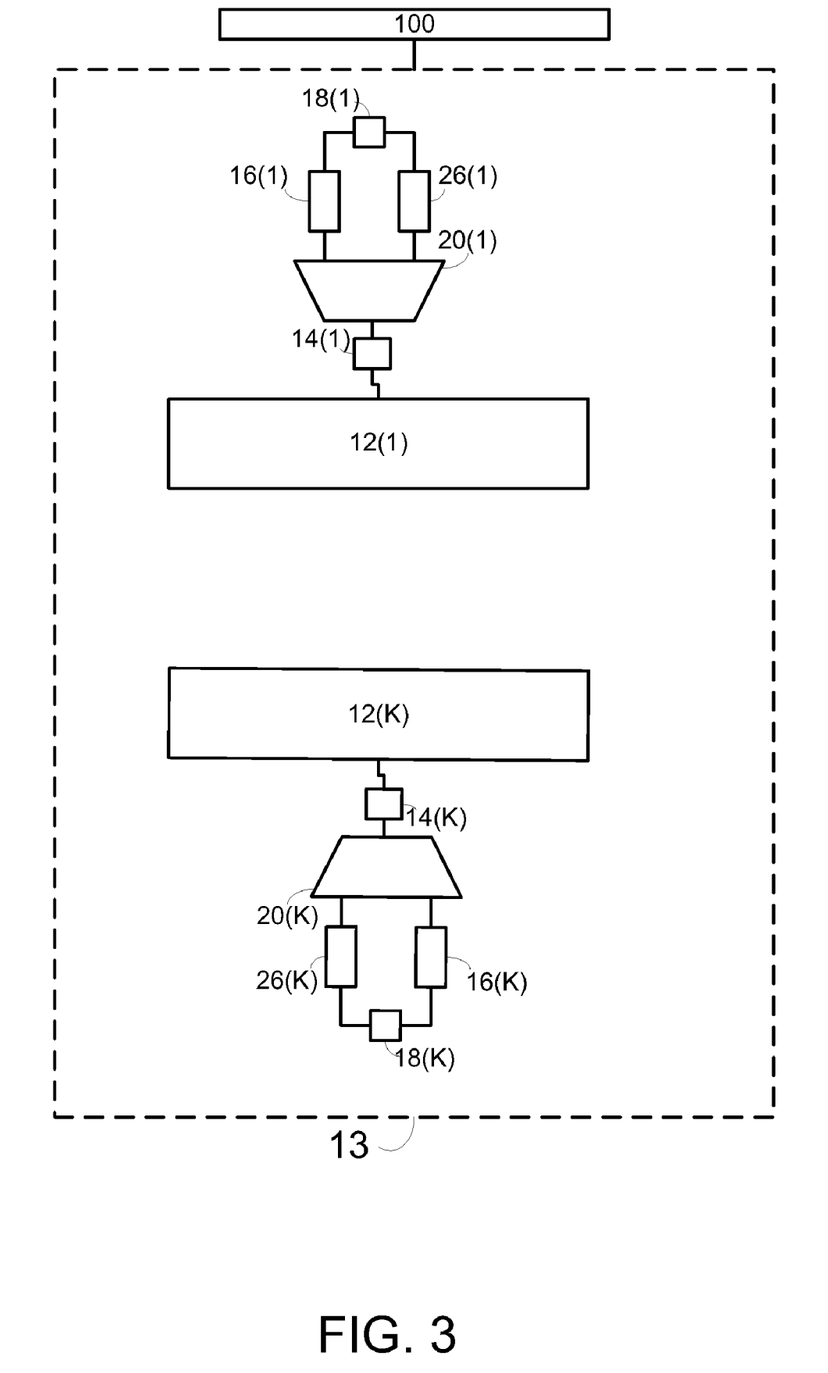
FIG. 3 schematically shows an example of an embodiment of an integrated circuit and of an external tester.

FIG. 3 schematically shows an example of an embodiment of an integrated circuit 13.

Integrated circuit 13 differs from integrated circuit 10 of FIG. 1 by including a single test pin per module and a multiplexer that selects which resistor to connect between a supply pin and a test pin.

First test pin 18(1) is connected to a first end of first resistor 16(1) and to a first end of second resistor 26(1). The second end of these resistors is connected to inputs of multiplexer 20(1). An output of multiplexer 20(1) is connected to supply pin 14(1).

When the low power mode quiescent current of module 12(1) is measured, multiplexer 20(1) selects first resistor 16(1) causing first resistor 16(1) to be connected between first test pin 18(1) and supply pin 14(1).

When the normal mode quiescent current of module 12(1) is measured, multiplexer 20(1) selects second resistor 26(1) causing second resistor 26(1) to be connected between first test pin 18(1) and supply pin 14(1).

Third test pin 18(K) is connected to a first end of third resistor 16(K) and to a first end of fourth resistor 26(K). The second end of these resistors is connected to inputs of multiplexer 20(K). An output of multiplexer 20(K) is connected to supply pin 14(K).

When the low power mode quiescent current of module 12(K) is measured, multiplexer 20(K) selects third resistor 16(K) causing third resistor 16(K) to be connected between third test pin 18(K) and supply pin 14(K).

When the normal mode quiescent current of module 12(K) is measured then multiplexer 20(K) selects fourth resistor 26(K) causing fourth resistor 26(K) to be connected between third test pin 18(K) and supply pin 14(K).

Figure 4:
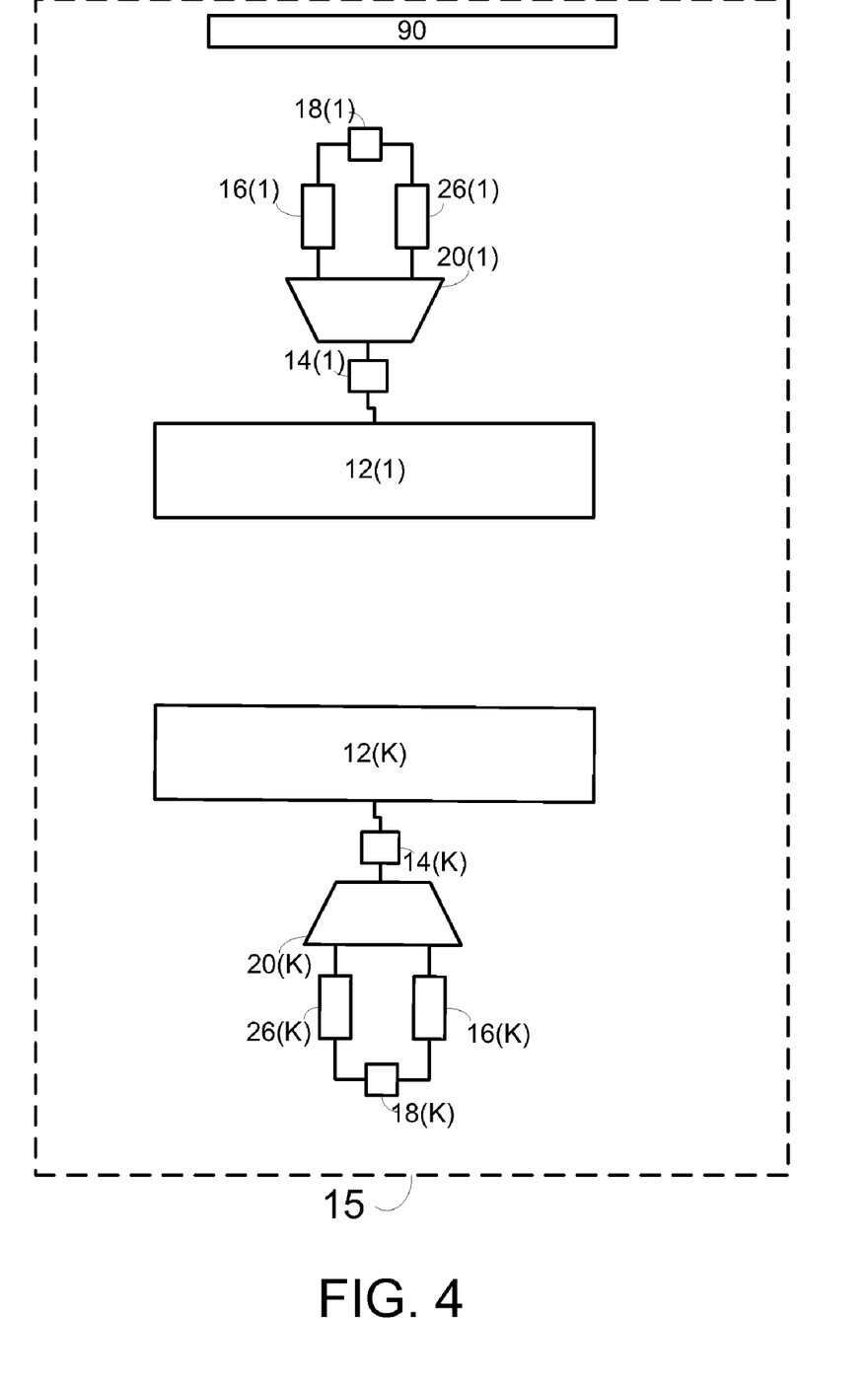
FIG. 4 schematically shows an example of an embodiment of an integrated circuit.

FIG. 4 schematically shows an example of an embodiment of an integrated circuit 15.

Integrated circuit 15 differs from integrated circuit 13 of FIG. 3 by including an internal tester 90 instead of external tester 100.

Internal tester 90 measures the voltage drop on first resistor 16(1), third resistor 1(K), second resistor 26(1) and fourth resistor 26(K).

Modules 12(1) and 12(K) receive their supply voltage via supply pins 14(1) and 14(K) when their quiescent current is not measured. A supply voltage is supplied to first test pin 18(1) when the quiescent current of module 12(1) is measured. A supply voltage is supplied to third test pin 18(K) when the quiescent current of module 12(K) is measured.

Figure 5:
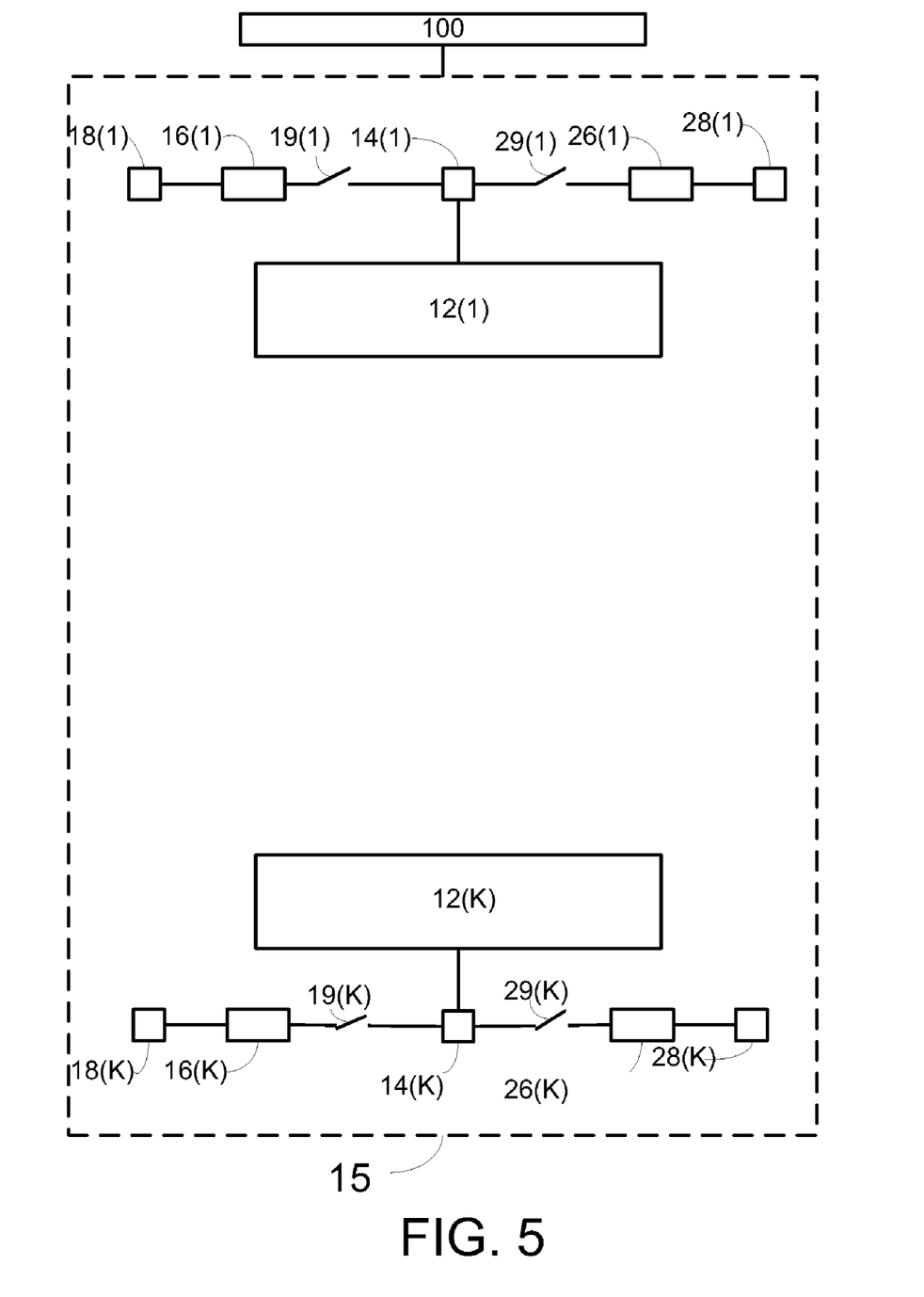
FIG. 5 schematically shows an example of an embodiment of an integrated circuit and of an external tester.

FIG. 5 schematically shows an example of an embodiment of an integrated circuit 15.

Integrated circuit 15 differs from integrated circuit 10 of FIG. 1 by including switches that isolate the test paths from the supply pins when these test paths are not used.

First switch 19(1) is connected between supply pin 14(1) and first resistor 16(1). It is closed (thereby connecting resistor 16(1) to supply pin 14(1)) only when the low power mode quiescent current of module 12(1) is measured.

Second switch 29(1) is connected between supply pin 14(1) and second resistor 26(1). It is closed (thereby connecting resistor 26(1) to supply pin 24(1)) only when the low power mode quiescent current of module 12(1) is measured.

Third switch 19(K) is connected between supply pin 14(K) and third resistor 16(K). It is closed (thereby connecting resistor 16(K) to supply pin 14(K)) only when the low power mode quiescent current of module 12(K) is measured.

Fourth switch 29(K) is connected between supply pin 14(K) and fourth resistor 26(K). It is closed (thereby connecting resistor 26(K) to supply pin 14(K)) only when the low power mode quiescent current of module 12(K) is measured.

It is noted that these switches can also be included in an integrated circuit 11 of FIG. 2.

Referring to the examples of FIG. 3 and FIG. 4, the test path can be disconnected by adding a switch or by adding another input to each multiplexer which, once selected, can provide substantially the same effect as isolating the test path. It can be connected to a very large resistance load.

Figure 6:
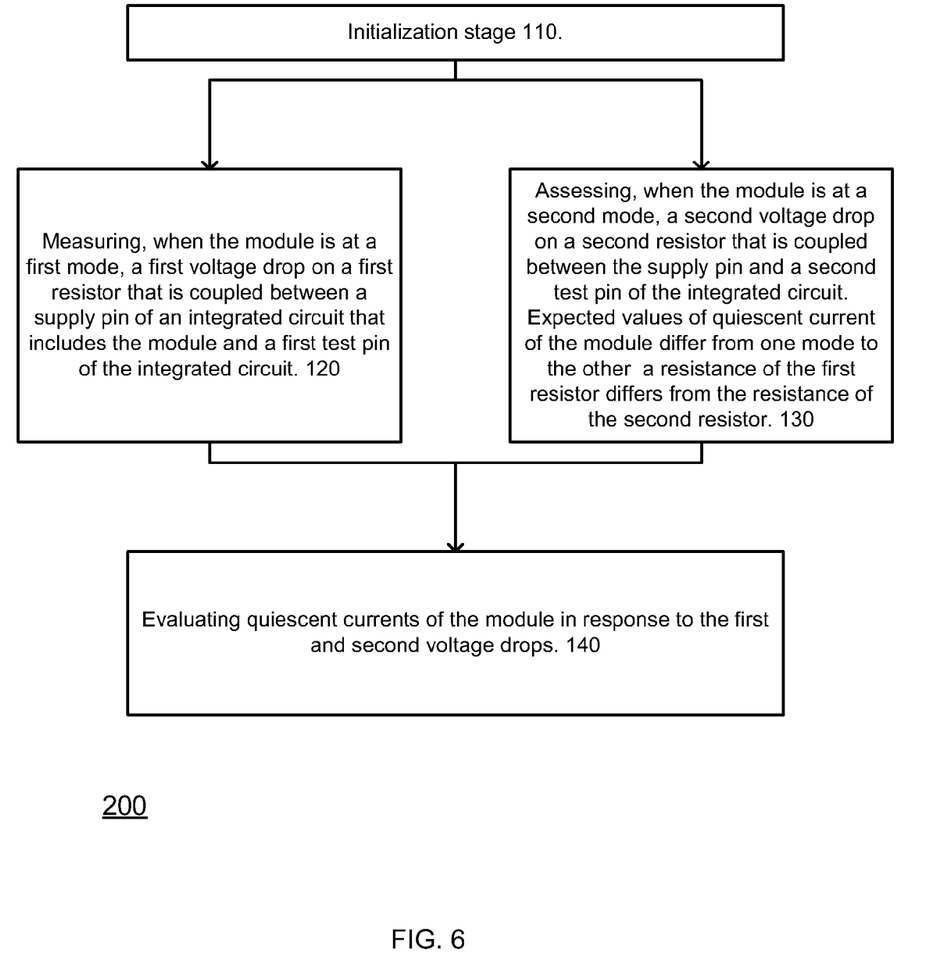
FIG. 6 schematically shows an example of an embodiment of a method for measuring a quiescent current.

FIG. 6 schematically shows an example of an embodiment of method 200 for measuring a quiescent current.

Method 200 starts by initialization stage 110.

Initialization stage 110 can include setting a tester, before measuring a first voltage drop, to measure a voltage drop within an expected voltage drop range associated with the measuring; and setting a tester, before assessing a second voltage drop, to measure a voltage drop within an expected voltage drop range associated with the assessing.

Stage 110 is followed by stages 120 and 130.

Stage 120 includes measuring, when the module is at a first mode, a first voltage drop on a first resistor that is coupled between a supply pin of an integrated circuit that includes the module and a first test pin of the integrated circuit.

Stage 120 includes assessing, when the module is at a second mode, a second voltage drop on a second resistor that is coupled between the supply pin and a second test pin of the integrated circuit. Expected values of quiescent current of the module differ from one mode to the other and resistance of the first resistor differs from the resistance of the second resistor.

Stage 120 and 130 are followed by stage 140 of evaluating quiescent currents of the module in response to the first and second voltage drops.

The first test pin can differ from the second test pin, as illustrated in the example of FIG. 1, FIG. 2, and FIG. 5.

The first test pin can be the second test pin, as illustrated in the example of FIG. 3 and FIG. 4. In this case a multiplexer is connected between the first and second resistors and the supply pin. The measuring involves selecting one input of the multiplexer while stage 120 of the assessing includes selecting another input of the multiplexer. These different inputs are connected to different resistors out of the first and second resistors.

Stage 120 can involve measuring low power mode quiescent current and stage 130 can involve measuring normal mode quiescent current. The ratio between resistances of the first resistor to a resistance of the second resistor can exceed ten and can even exceed one hundred.

Either one of stages 120 and 130 can be implemented by an external tester or by an internal tester.

Method 200 and especially stages 120 and 130 can be repeated for multiple modules of the integrated circuit.

Figure 7:
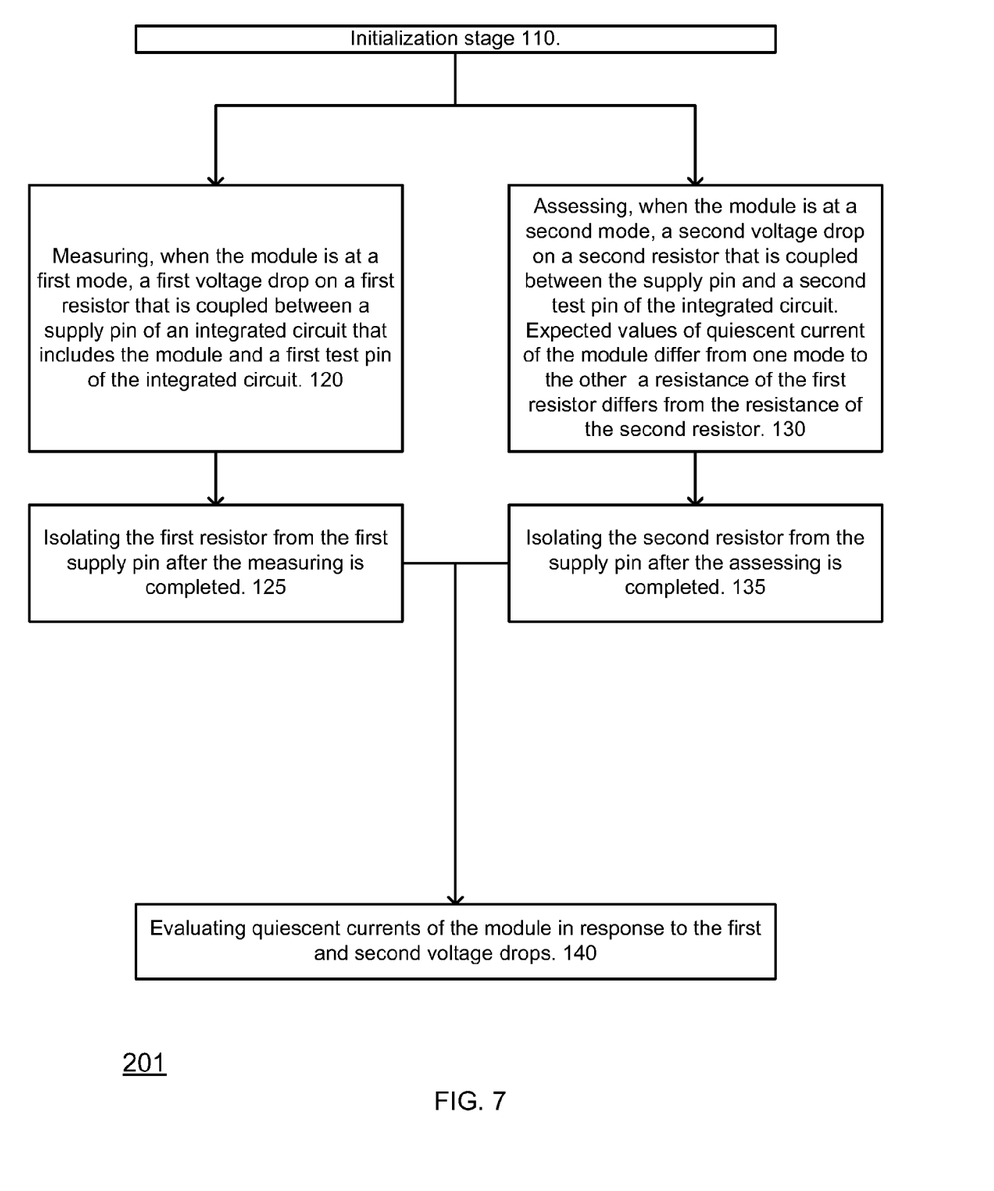
FIG. 7 schematically shows an example of an embodiment of a method for measuring a quiescent current.

FIG. 7 schematically shows an example of an embodiment of method 201 for measuring a quiescent current.

Method 201 differs from method 200 by including stage 135 and 125. Stage 135 follows stage 130 and precedes stage 140. Stage 125 follows stage 120 and precedes stage 140.

Stage 125 includes isolating the first resistor from the first supply pin after the measuring is completed. Stage 135 includes isolating the second resistor from the supply pin after the assessing is completed.

Figure 8:
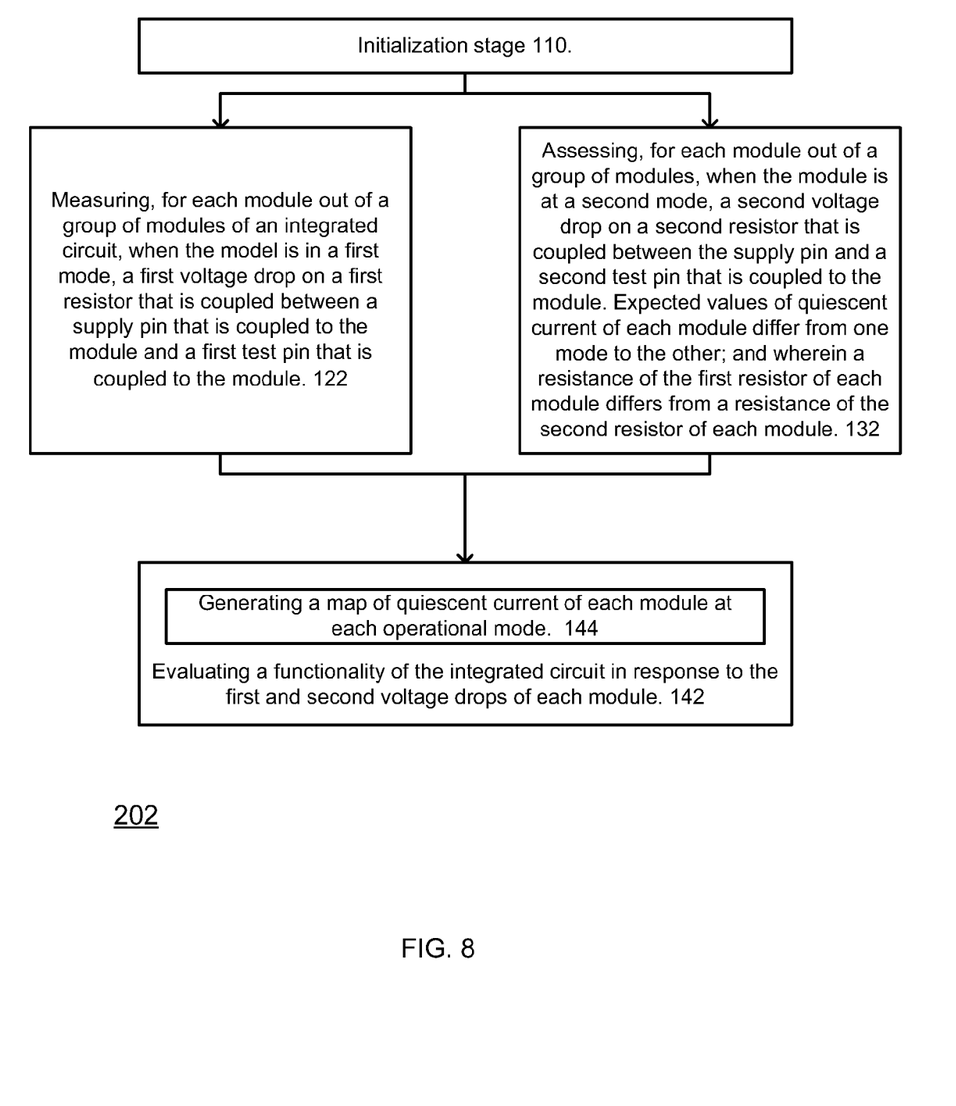
FIG. 8 schematically shows an example of an embodiment of a method for measuring a quiescent current.

FIG. 8 schematically shows an example of an embodiment of method 202 for measuring a quiescent current.

Method 202 starts by initialization stage 110.

Stage 110 can include setting the tester, before the measuring, to measure a voltage drop within an expected voltage drop range associated with the measuring; and setting the tester, before the assessing, to measure a voltage drop within an expected voltage drop range associated with the assessing.

Stage 110 is followed by stage 122 and 132.

Stage 122 includes measuring, for each module out of a group of modules of an integrated circuit, when the model is in a first mode, a first voltage drop on a first resistor that is coupled between a supply pin that is coupled to the module and a first test pin that is coupled to the module.

Stage 122 can include multiple iterations of stage 120 of FIG. 6.

Stage 132 includes assessing, for each module out of a group of modules, when the module is at a second mode, a second voltage drop on a second resistor that is coupled between the supply pin and a second test pin that is coupled to the module. Expected values of quiescent current of each module differ from one mode to the other; and wherein a resistance of the first resistor of each module differs from a resistance of the second resistor of each module. Stage 132 can include multiple iterations of stage 130 of FIG. 6.

Stages 122 and 132 are followed by stage 142 of evaluating a functionality of the integrated circuit in response to the first and second voltage drops of each module.

The integrated circuit can be regarded as fully functional if all quiescent currents are within functional ranges.

Stage 142 can include stage 144 of generating a map of quiescent current of each module at each operational mode. This map can assist in evaluating the functionality of the various modules and help in determining the faults (in any) in the manufacturing process.

Method 202 can also include stages such as stage 125 and 135 of isolating a test path of a module once a test ends.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. In addition, plurality of conductors may be replaced with a single conductor that transfers multiple signals serially or in a time-multiplexed manner. Likewise, single conductors carrying multiple signals may be separated out into various different conductors carrying subsets of these signals. Therefore, many options exist for transferring signals.

Although the invention has been described with respect to specific conductivity types or polarity of potentials, skilled artisans appreciate that conductivity types and polarities of potentials may be reversed.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

In addition, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device.

However, other modifications, variations, and alternatives are also possible. The specifications and drawings are, accordingly, to be regarded in an illustrative rather than in a restrictive sense.

The word 'comprising' does not exclude the presence of other elements or steps from those listed in a claim. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

We claim:

1. A method for evaluating a quiescent current, the method comprises:
    measuring, when a module is at a first mode, a first voltage drop on a first resistor that is coupled between a supply pin of an integrated circuit that comprises the module and a first test pin of the integrated circuit;
    assessing, when the module is at a second mode, a second voltage drop on a second resistor that is coupled between the supply pin and a second test pin of the integrated circuit; and
    evaluating a quiescent current of the module in response to the first and second voltage drops;
    wherein expected values of quiescent current of the module differ from one mode to the other; and wherein a resistance of the first resistor differs from the resistance of the second resistor.

2. The method according to claim 1 wherein the first test pin is the second test pin and wherein the first and second resistors are coupled between the first test pin and a multiplexer that selects which resistor to couple to the supply pin.

3. The method according to claim 1 wherein the first test pin differs from the second test pin.

4. The method according to claim 1 wherein the first mode is a low power mode and wherein the second mode is a non-low power mode; and wherein a ratio between a resistance of the first resistor to a resistance of the second resistor exceeds ten.

5. The method according to claim 1 wherein the first mode is a low power mode and wherein the second mode is a non-low power mode; and wherein a ratio between a resistance of the first resistor to a resistance of the second resistor exceeds one hundred.

6. The method according to claim 1 comprising measuring and evaluating by an external tester.

7. The method according to claim 6 comprising:
    setting the tester, before the measuring, to measure a voltage drop within an expected voltage drop range associated with the measuring; and
    setting the tester, before the assessing, to measure a voltage drop within an expected voltage drop range associated with the assessing.

8. The method according to claim 1 comprising measuring and evaluating an internal test circuit.

9. The method according to claim 1 comprising repeating the measuring, assessing and evaluating for each module out of a group of modules of the integrated circuit.

10. The method according to claim 1 comprising isolating the first resistor from the first supply pin after the measuring is completed and isolating the second resistor from the supply pin after the assessing is completed.

11. A method for evaluating a quiescent current, the method comprises:
    measuring, for each module out of a group of modules of an integrated circuit, when the module is in a first mode, a first voltage drop on a first resistor that is coupled between a supply pin that is coupled to the module and a first test pin that is coupled to the module;
    assessing, for each module out of a group of modules, when the module is at a second mode, a second voltage drop on a second resistor that is coupled between the supply pin and a second test pin that is coupled to the module; and
    evaluating a functionality of the integrated circuit in response to the first and second voltage drops of each module;
    wherein expected values of quiescent current of each module differ from one mode to the other; and wherein a resistance of the first resistor of each module differs from a resistance of the second resistor of each module.

12. The method according to claim 11 comprising generating a map of quiescent current of each module at each operational mode.

13. The method according to claim 11 comprising:
    setting the tester, before the measuring, to measure a voltage drop within an expected voltage drop range associated with the measuring; and
    setting the tester, before the assessing, to measure a voltage drop within an expected voltage drop range associated with the assessing.

14. The method according to claim 11 comprising measuring and evaluating an internal test circuit.

15. The method according to claim 11 wherein the first test pin of each module is the second test pin of each module and wherein the first and second resistors of each module are coupled between the first test pin of each module and a multiplexer of each module that selects which resistor to couple to the supply pin of each module.

16. An integrated circuit, comprising:
    at least one module that can be placed, at a given point in time, in a first mode or in a second mode; wherein an expected quiescent current of the module differs from one mode to the other; and
    multiple test paths, coupled to each module, wherein a first test path is associated with the first mode and a second test path is associated with the second mode;
    wherein the first test path comprises a first test pin and a first resistor and the second test path comprises a second test pin and a second resistor;
    wherein the first resistor is coupled between the first test pin and a supply pin of the module;
    wherein the second resistor is coupled between the second test pin and a supply pin of the module;

wherein a quiescent current of the module when placed at a first mode, is measured by supplying a supply voltage to the first test pin and measuring a voltage drop on the first resistor; and wherein a quiescent current of the module when placed at a second mode, is measured by supplying a supply voltage to the second test pin and measuring a voltage drop on the second resistor.

17. The integrated circuit according to claim 16 wherein the first test pin is the second test pin and wherein the first and second resistors are coupled between the first test pin and a multiplexer that selects which resistor to couple to the supply pin.

18. The integrated circuit according to claim 16 wherein the first mode is a low power mode and wherein the second mode is a non-low power mode; and wherein a ratio between a resistance of the first resistor to a resistance of the second resistor exceeds one hundred.

19. The integrated circuit according to claim 16 wherein each test path comprises an isolator that isolates the test path from the supply pin after measuring the voltage drop on the resistor of the test path.

20. The integrated circuit according to claim 16 comprising an internal tester that is coupled to the multiple test paths.

\* \* \* \* \*